United States Patent [19]

Nossen

[11] 4,114,110
[45] Sep. 12, 1978

[54] FREQUENCY SYNTHESIZER

[75] Inventor: Edward J. Nossen, Cherry Hill, N.J.

[73] Assignee: The United States of America as represented by the Secretary of the Army, Washington, D.C.

[21] Appl. No.: 856,448

[22] Filed: Dec. 1, 1977

[51] Int. Cl.² ............................................. H03B 3/04
[52] U.S. Cl. ........................................ 331/2; 332/19
[58] Field of Search ................. 332/19; 340/347 DA; 329/104; 331/2

[56] References Cited

U.S. PATENT DOCUMENTS

| | | | |
|---|---|---|---|
| 3,689,914 | 9/1972 | Butler | 340/347 DA |
| 3,838,350 | 9/1974 | Ewanus | 329/104 |
| 4,021,757 | 5/1977 | Nossen | 332/19 |
| 4,060,773 | 11/1977 | Hata et al. | 332/19 |

Primary Examiner—John Kominski
Attorney, Agent, or Firm—Nathan Edelberg; Sheldon Kanars; Bernard Franz

[57] ABSTRACT

Dual phase lock loops are used to provide a rapid switching, low power, low spurious and fine resolution frequency synthesizer for various radio applications. The first phase lock loop provides for coarse frequency adjustment, and the second phase lock loop includes an arithmetic synthesizer for fine resolution.

10 Claims, 4 Drawing Figures

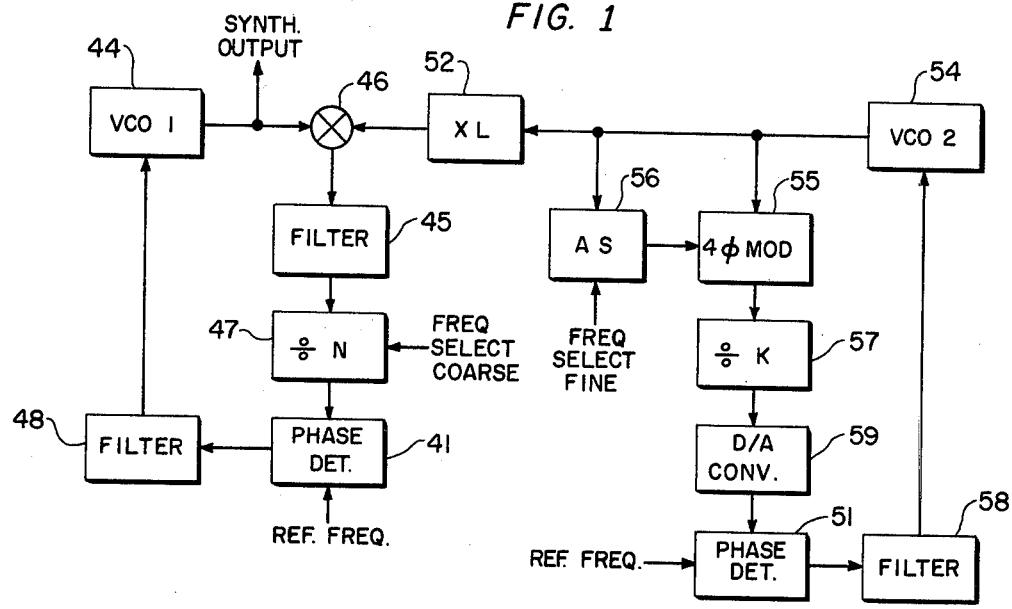
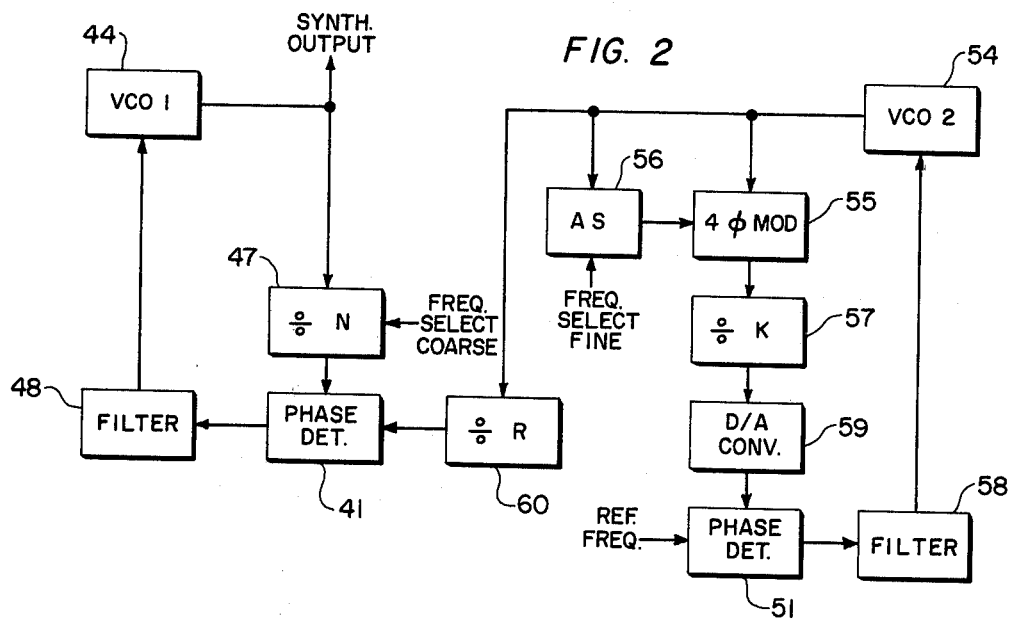
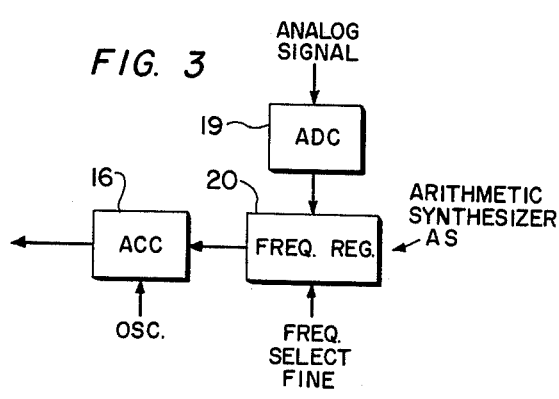
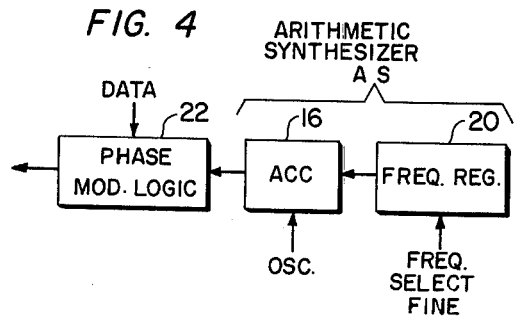

FREQUENCY SYNTHESIZER

The invention described herein may be manufactured and used by or for the Government for governmental purposes without the payment of any royalties thereon or therefor.

BACKGROUND OF THE INVENTION

This invention relates to a frequency synthesizer and, more particularly, an arrangement using phase lock loops with one loop including an arithmetic synthesizer for fine resolution.

Prior art approaches to frequency synthesizers have included direct synthesizers utilizing a multiplicity of selectable frequency sources and mixing stages. Other approaches include indirect synthesizers using one or more phase lock loops to achieve the desired number of frequencies.

An object of this invention is to provide a rapid switching, low power, low spurious and fine resolution frequency synthesizer.

SUMMARY OF THE INVENTION

A first phase lock loop includes a voltage controlled oscillator (VCO), a phase detector, and a low pass filter for coupling the output signal from the phase detector in the VCO to control its frequency. A second phase lock loop also includes a phase detector and a low pass filter for coupling the output signal from the phase detector to its VCO, and also includes an arithmetic synthesizer for fine frequency control. This second phase lock loop also includes a phase modulator.

BRIEF DESCRIPTION OF THE DRAWINGS

FIGS. 1 and 2 are block diagrams of two embodiments of the invention; and

FIGS. 3 and 4 are block diagrams of the arithmetic synthesizer for use in either FIG. 1 or FIG. 2 with arrangements for modulation.

DETAILED DESCRIPTION OF THE INVENTION

This disclosure describes a frequency synthesizer which provides fast settling time, at low power dissipation as well as fine frequency resolution and low spurious output signals. It is related to my previous U.S. Pat. No. 4,021,757.

The frequency synthesizer basically uses a dual loop configuration, which incorporates an arithmetic synthesizer to provide very fine frequency increments. Two configurations are disclosed; one is Configuration A in FIG. 1, which applies to relatively high output frequencies, while Configuration B shown in FIG. 2 is applicable to lower output frequencies.

In Configuration A (FIG. 1), the voltage controlled oscillator (VCOL) 44 operates at the desired output frequency. It is down converted to a lower frequency in a mixer 46 by means of a translation signal in the mixer 46, and the filter 45 removes unwanted frequency components. The resulting lower frequency is then applied to a programmable divide by N counter 47, whose output drives a phase detector 41. The divide by N counter 47 has the value of N adjustable to provide for coarse frequency selection. A reference frequency is also applied to the phase detector 41 so that phase errors will produce a correction voltage, which is filtered and applied to the first VCO 44. The offset frequency (translation signal) introduced into the mixer 46 of this phase lock loop is derived from a second phase lock loop which consists of a second voltage controlled oscillator 54, a four-phase modulator 55, a divide by K counter 57, a digital-to-analog converter 59, and phase detector 51. An external reference is also supplied to this phase detector to derive a phase error signal, which after filtering, causes correction of the output frequency of the second VCO 54. This output frequency is also used as the clock signal for an arithmetic synthesizer 56. This arithmetic synthesizer is commanded with a frequency number, and its output frequency is used to sidestep the second VCO 54 signal. A single sideband translation is effected as described in my U.S. Pat. No. 4,021,757. Similarly, frequency or phase modulation can be introduced at this point as described in that patent. The output frequency of the second VCO 54 may be multiplied by an optional multiplier 52 to obtain the offset injection frequency for the primary phase lock loop; this injection frequency being supplied to the mixer 46.

Unique features of this configuration are that coarse frequency selection is obtained in a conventional manner by means of the programmable divide by N counter 47. Fine frequency selection is achieved by means of the arithmetic synthesizer 56 and the second VCO phase lock loop.

A novel feature is the use of the second VCO 54 output signal as the clock for the arithmetic synthesizer 56. This avoids the need for a separate clock frequency source, and furthermore, an effective negative feedback is achieved by using the clock frequency dependent on the arithmetic synthesizer's output. Spurious frequencies tend to be randomized by this technique and spread over a larger frequency band thus reducing their amplitude. Using a digital-to-analog converter on the individual divide by K counter 57 stages results in the generation of a triangular waveform instead of a rectangular waveform. Harmonics of the triangular waveform are reduced as $(1/N)^2$ instead of $1/N$.

Consequently, fewer undesired frequency components are present at the phase detector and aliasing between these frequency components is therefore minimized. Spectral purity improvements of the order of 30 dB can be obtained by the addition of the digital-to-analog converter in the loop.

The general configuration of sidestepping the first VCO output frequency by the (multiplied) second VCO output produces a substantially lower difference frequency, which is fillered and divided by N. Because this frequency is lower, low power logic families, such as CMOS and CMOS/SOS, can be applied and thus substantially reduce the power dissipation of the synthesizer. Similarly, by proper selection of the second VCO output frequency, the divide by K counter 57 can be operated at a frequency range where maximum use of low power digital logic circuits can be achieved.

In the B configuration (FIG. 2), the second phase lock loop which includes the second VCO 54 is identical. However, the first VCO loop does not include the offset frequency and mixer by virtue of its lower output frequency. This configuration is applicable where the output frequency allows the use of low power programmable counters. Instead of providing frequency interpolation by offsetting the first VCO output, the resolution signal produced by the second VCO 54 is divided in a divide-by-R counter 60 to produce a phase reference for the primary loop. In the division process, residual spurious signals from the second VCO are further divided. While the frequency interpolation now becomes dependent on the selected value of N, the arithmetic synthesizer can provide sufficiently fine steps so that the desired output frequency can be obtained by selecting the proper coarse and fine frequency control words.

It should be noted that the second VCO loop serves as a reference for the relatively small frequency deviation. Its primary objective is to provide a very clean reference, which can be incremented in very fine steps in a short time. The time required for a frequency change is negligible within the arithmetic synthesizer and is therefore primarily determined by the loop bandwidth. This, in turn, is a function of the magnitude of the reference frequency. If the reference frequency is made sufficiently high, the loop bandwidth of both the primary and the reference loops can be high enough to provide very rapid frequency settling.

Key features of the B configuration are that the arithmetic synthesizer is clocked by the VCO, that is, by a variable frequency rather than a fixed frequency which has proven to reduce spurious outputs. Furthermore, the inclusion of a digital-to-analog converter reduces the amplitude of unwanted harmonics and spurious signals and the resulting aliasing. The cascaded loops also provide improved filtering to further reject unwanted spurious signals. The configuration of FIG. 2 is preferable where applicable, since the use of a multiplier and mixer is avoided. Both can increase existing spurious levels and introduce additional spurious signals.

Four-phase modulators and single sideband modulators are well known in the art and need not be described in detail. (See, for example, U.S. Pat. No. 3,838,350, and for phase modulators generally, U.S. Pat. No. 3,755,739. See also, *Information Transmission, Modulation and Noise,* Schwartz, 2d Ed. (McGraw-Hill, 1970, Chapter 4).) As shown in FIGS. 3 and 4, the arithmetic synthesizer 56 comprises principally an accumulator 16 and a frequency register 20. The four-phase modulator 55 is controlled by the output signal from the accumulator 16. The arithmetic synthesizer driving the four-phase modulator 55 makes possible the transmission of analog signals or digital signals, the analog signals being converted to digital signals as shown in FIG. 3 by an analog-to-digital converter 19. The operation of an arithmetic synthesizer is described in detail in Butler U.S. Pat. No. 3,689,914.

The digital accumulator such as 16 is an operating device for adding an input signal to a stored digital signal in response to a control or clocking pulse. The output signal from the accumulator is the start digital value, which is increased at each clocking pulse by an amount equal to the input signal. As described in my said U.S. Pat. No. 4,021,757, an accumulator can be assembled from commercially available devices.

An arrangement for phase modulation with data is shown in FIG. 4 in which the output from the accumulator 16 is modulated in block 22 before being applied to the four-phase modulator 55.

The operation of a phase lock loop similar to that using a second VCO 54 with an arithmetic synthesizer 56 and the modulation arrangements shown in FIGS. 3 and 4 is more fully described in my said U.S. Pat. No. 4,021,757.

What is claimed is:

1. A frequency synthesizer comprising a first phase lock loop including first voltage-controlled oscillator means, first phase detector means coupled to clock means, a divide by N counter coupled between the output of the first voltage-controlled oscillator means and the first phase detector means, the value of N being used for coarse frequency selection, and first low pass filter means for coupling an output signal from the first phase detector means to control the frequency of the synthesized output signal from the first voltage-controlled oscillator means;

a second phase lock loop including a second voltage-controlled oscillator means, a phase modulator means coupled to the output of the second voltage-controlled oscillator means, second phase detector means coupled to an output of the phase modulator means and to clock means, and second low pass filter means for coupling an output signal from the second phase detector means to control the frequency of the second voltage-controlled oscillator means, said second phase lock loop further including an arithmetic synthesizer for fine frequency selection with its output supplied to said phase modulator means; and loop coupling means for coupling a signal derived from the output of said second voltage-controlled oscillator means to the first phase detector means of the first phase lock loop.

2. A frequency synthesizer as claimed in claim 1, wherein said phase modulator means is a four-phase modulator.

3. A frequency synthesizer as claimed in claim 1, wherein the output of said second voltage-controlled oscillator means is used as a clock signal to said arithmetic synthesizer.

4. A frequency synthesizer as claimed in claim 3, having modulator control means which includes said arithmetic synthesizer for coupling a modulating signal to said phase modulator means.

5. A frequency synthesizer as claimed in claim 1, wherein there is coupled between said phase modulator means and said second phase detector means a divide by K counter.

6. A frequency synthesizer as claimed in claim 1, wherein there is coupled between said phase modulator means and said second phase detector means a divide by K counter followed by a digital-to-analog converter to produce a triangular waveform.

7. A frequency synthesizer as claimed in claim 1, wherein said loop coupling means comprises a mixer with one input from said first voltage-controlled oscillator means, another input from said signal derived from the output of said second voltage-controlled oscillator means, and the mixer output coupled via further filter means to said divide by N counter.

8. A frequency synthesizer as claimed in claim 7, further including a frequency multiplier coupled between the output of said second voltage-controlled oscillator means and said mixer.

9. A frequency synthesizer as claimed in claim 1, wherein said loop coupling means comprises a divide by R counter coupled directly between the output of said second voltage-controlled oscillator means and said first phase detector means.

10. In a phase lock loop including voltage-controlled oscillator means, phase detector means coupled to clock means, and low pass filter means for coupling an output signal from the phase detector means to control the frequency of an output signal from said voltage-controlled oscillator means, the improvement comprising:

phase modulator means coupling said output signal to said phase detector means for modulating and for translating the frequency of said voltage-controlled oscillator; and modulator control means including an arithmetic synthesizer for coupling a modulating signal to said modulator means, with the output of said voltage-controlled oscillator means used as a clock signal to said arithmetic synthesizer.

* * * * *